United States Patent [19]

Berry et al.

[11] 4,033,795

[45] * July 5, 1977

[54] METHOD FOR INDUCING UNIAXIAL MAGNETIC ANISOTROPY IN AN AMORPHOUS FERROMAGNETIC ALLOY

[75] Inventors: Brian S. Berry, Ossining; Walter C. Pritchet, Mahopac, both of N.Y.

[73] Assignee: International Business Machines Corporation, Armonk, N.Y.

[ * ] Notice: The portion of the term of this patent subsequent to June 25, 1991, has been disclaimed.

[22] Filed: June 4, 1974

[21] Appl. No.: 476,641

Related U.S. Application Data

[62] Division of Ser. No. 214,127, Dec. 30, 1971, Pat. No. 3,820,040.

[52] U.S. Cl. .............................. 148/108; 75/123 D; 148/31.55; 331/156
[51] Int. Cl.² .................... C21D 1/04; H03B 5/30
[58] Field of Search ............... 148/108, 105, 31.55; 324/43; 331/156; 75/126 A, 126 R, 123 R, 123 D; 106/47 R

[56] References Cited

UNITED STATES PATENTS

| | | | |
|---|---|---|---|
| 3,138,494 | 6/1964 | Burket et al. ..................... 148/108 |
| 3,409,479 | 11/1968 | Greenberg et al. ................ 148/108 |
| 3,413,055 | 11/1968 | De Sorbo ........................ 106/47 R |
| 3,427,154 | 2/1969 | Mader et al. .................... 148/31.55 |
| 3,472,708 | 10/1969 | Schindler et al. ................ 148/108 |
| 3,607,460 | 9/1971 | Lommel .......................... 148/31.55 |
| 3,782,958 | 1/1974 | Bishay et al. ................... 106/47 R |
| 3,820,040 | 6/1974 | Berry et al. ..................... 331/156 |
| 3,856,513 | 12/1974 | Chen et al. ..................... 75/126 R |

OTHER PUBLICATIONS

Sinha, A; *Temp. ⅃ Field Dependence of Mag. of Amorphous (Fe, Mn)–P–C–Alloys*, in Journ. Appl. Phys., 42, Jan. 1971, pp. 338–342.

Berry, B., et al., *Obtaining a Hard Mag. Array in Magnetically Soft Matrix*, in IBM Tech. Discl., 16, Sept. 1973, pp. 1191–1192.

Borrelli, N. F., *Faraday Effect in Glasses*, in Proc. VII Int. Congress on Glass, Brussels, 1965, pp. 43.1–43.4.

Bozorth, R. M., *Ferromagnetism*, New York, 1951, pp. 684–687.

*Primary Examiner*—Walter R. Satterfield
*Attorney, Agent, or Firm*—Bernard N. Wiener

[57] ABSTRACT

Through the practice of this invention there is achieved control of the vibrational frequency of an electromechanical oscillator. This is achieved by utilizing the change in Young's modulus of elasticity which occurs for certain materials with applied magnetic field, known as the ΔE-effect. By selective annealing in the presence of specially directed magnetic field, the ΔE-effect is selectively altered along specific directions in the vibrational member. Additionally, by control of the ΔE-effect of a sonic delay line, there is achieved control of the delay time for an acoustic pulse propagating therein.

6 Claims, 19 Drawing Figures

MODES OF A CANTILEVER

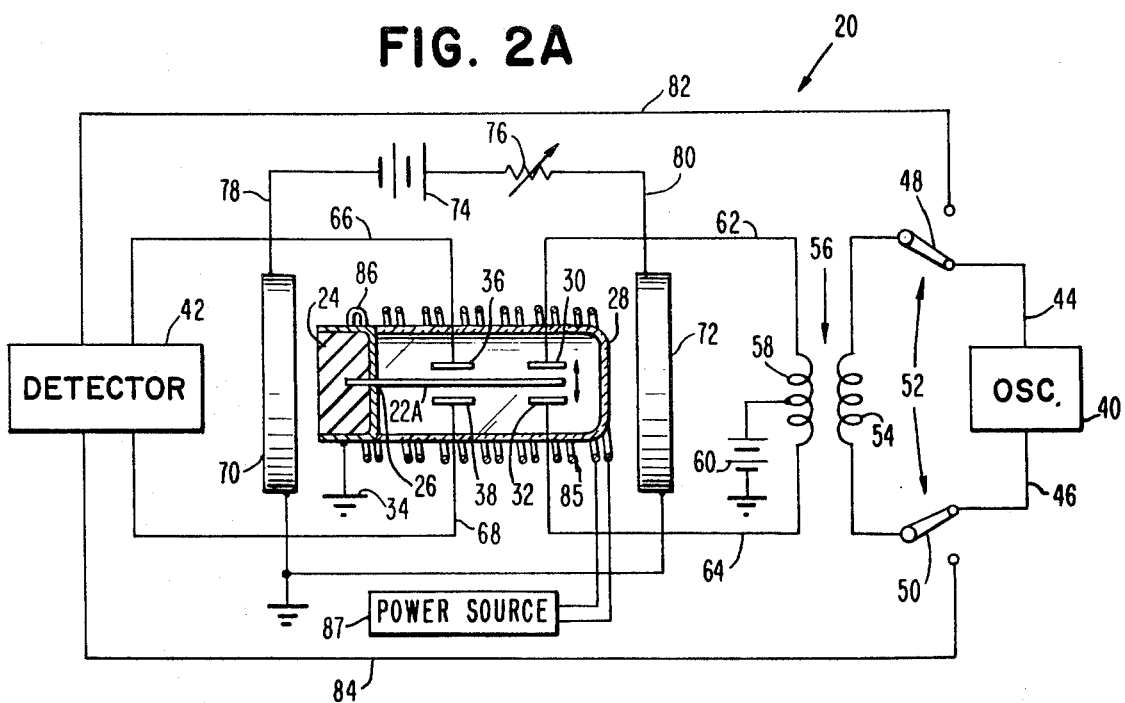
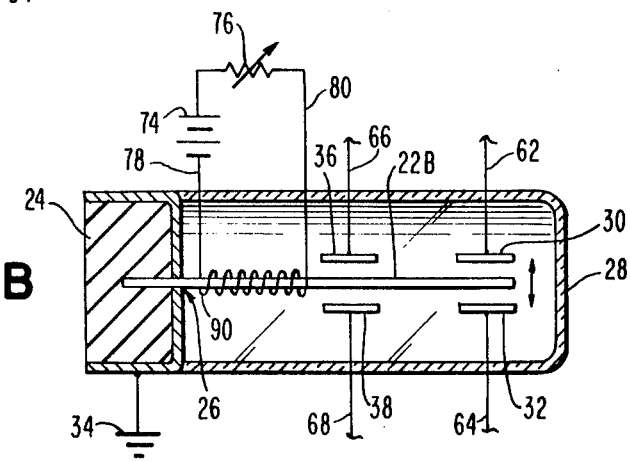
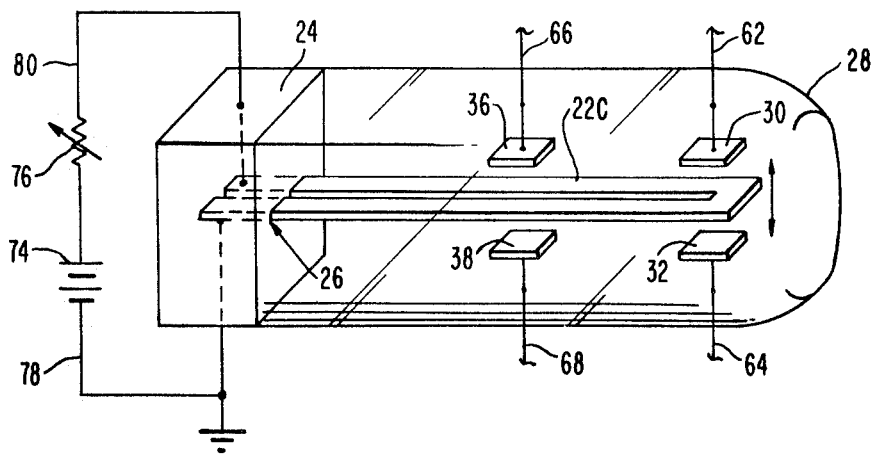

METHOD FOR INDUCING UNIAXIAL MAGNETIC ANISOTROPY IN AN AMORPHOUS FERROMAGNETIC ALLOY

This is a division of application Ser. No. 214,127 filed Dec. 30, 1971, now U.S. Pat. No. 3,820,040 issued June 25, 1974.

BACKGROUND OF THE INVENTION

It is known in the prior art that certain materials have significant change in Young's modulus of elasticity with applied magnetic field, known as the ΔE-effect. However, practical use of the ΔE-effect has not heretofore been introduced for electromechanical vibrating systems.

The frequency of vibration of a vibrating reed is known to be $$f_n = K_n \frac{d}{l^2} \sqrt{\frac{E}{\rho}}$$

where
$f_n$ = frequency of the $n$-th tone
$K_n$ = constant dependent on $n$
$d$ = thickness of the reed
$l$ = length of the reed
$E$ = Young's modulus of elasticity
$\rho$ = density of the material, and and
$f_1 : f_2 : f_3 : f_4 = (1.2)^2 : 3^2 : 5^2 : 7^2$, i.e., 1:6.26 : 17.5:34.4.

OBJECTS OF THE INVENTION

It is the primary object of this invention to provide control of the frequency of vibration of a vibrating system.

It is another object of this invention to provide a means for adjusting to a precise value the frequency of vibration of a vibrating system.

It is another object of this invention to provide a control of the frequency of vibration of vibrating system by adapting thereto a controllable magnetic field.

Another object of this invention is to achieve the immediately foregoing object by associating with said vibrating system a material whose modulus of elasticity is controllably variable by means of an externally applied magnetic field.

It is another object of this invention to achieve the immediately foregoing object of the invention by: adapting an especially fabricated additional part to an already given vibrational system; or fabricating a portion of the original vibrating system with a special material having an appropriate ΔE-effect.

It is another object of this invention to use the ΔE-effect to measure the strength and/or direction of a magnetic field.

It is another object of this invention to utilize the ΔE-effect of amorphous ferromagnetic alloys.

It is another object of this invention to use the ΔE-effect to control the velocity of an acoustic pulse in a sonic delay line to achieve a controllable delay thereof.

It is another object of this invention to design controllably the shape of a mechanical system member so as to maximize the ΔE-effect therein.

SUMMARY OF THE INVENTION

The premise of this invention is the utility of a significant variation in Young's modulus of elasticity with change in magnetic field, i.e., the ΔE-effect, for controlling either the vibrational frequencies of a mechanical system, or the velocity of an acoustic pulse within the material.

In the practice of an aspect of this invention the frequency of vibration of vibrating system is controlled by adapting thereto a controllable magnetic field.

In the practice of an aspect of this invention the vibrational properties of a fabricated part are modified by controllably associating therewith a volume of material with a variable E under an applied magnetic field, wherein the associated volume of material has its Young's modulus of elasticity E varied by an externally applied magnetic field via a specific magnetic system such as a coil or permanent magnets, by a direct current applied to the associated volume of material itself, or by direct current applied to another member of the fabricated part in proximity to said associated volume of material.

In the practice of another aspect of this invention, the ΔE-effect is used to measure the strength and/or direction of a magnetic field.

In the practice of another aspect of this invention use is made of the ΔE-effect to control the velocity of an acoustic pulse in a sonic delay line to achieve a controllable delay thereof.

In the practice of another aspect of this invention the shape of a mechanical system member is designed controllably so as to maximize the ΔE-effect therein.

THEORY OF THE INVENTION

The capability for the practice of this invention to change the natural frequencies of a vibrating system, or the velocity of sound through an acoustic transmission line, resides in the utilization of the ΔE-effect exhibited to various degrees by ferromagnetic materials. From previous work it can be understood that a large ΔE-effect is favored by the following conditions: (a) a large magnetostriction; and (b) a small internal stress together with a small magnetocrystalline anisotropy energy.

Although the magnetocrystalline anisotropy energy may be vanishingly small for certain special compositions in crystalline materials, attention is drawn to the expectation that this condition should be the rule rather than the exception in ferromagnetic materials having an amorphous structure. It has been discovered for the practice of this invention that a very favorable ΔE-effect can be produced in an amorphous ferromagnetic alloy of the composition $Fe_{75}P_{15}C_{10}$, which has been produced in accordance with the technique enunciated in the literature article by P. Duwez in *Transactions of the American Society for Metals*, Volume 60, 1967, pp. 607–633, by the method of splat cooling.

PRACTICE OF THE INVENTION

According to the specific objective desired for the practice of this invention, any of the following may be a desirable characteristic of a variable frequency mechanical oscillator built according to the principles of this invention:

a. a large overall frequency range;
b. a high sensitivity in terms of the fractional frequency change produced by unit applied field;
c. a small hysteresis effect, so that a unique variation exists between frequency and applied field;

d. a high mechanical Q (or low damping), so as to obtain a sharply peaked resonance giving a well-defined operating frequency, and also so as to minimize the power needed to sustain the vibration of the system;

e. a small temperature coefficient of Young's modulus, so that the frequency of the system is not subject to drift resulting from a change in the ambient temperature.

Consideration of the above factors also applies where the objective for the practice of this invention requires control of the velocity of sound.

Particular materials which are especially suitable for the practice of this invention are:

a. various crystalline materials with large magnetostriction and small magnetocrystalline anisotropy energy, such as nickel and certain iron-cobalt alloys.

b. the amorphous ferromagnetic material $Fe_{75}P_{15}C_{10}$.

The practice of this invention with materials of relatively large ΔE-effect relates particularly to electromechanical oscillators, e.g., a vibrating reed, which is maintained in resonant vibration by an electronic feedback loop between a pair of driving and detecting transducers. It is known that the frequency of vibration of a mechanical oscillator is proportional to the square root of Young's modulus. Through the practice of this invention use is made of the sensitivity of the frequency of vibration of a material with a ΔE-effect to the strength of the magnetic field which acts on the vibrating member of the mechanical oscillator.

As a further discovery to enhance the practice of this invention, it has been found that the amorphous alloy $Fe_{75}P_{15}C_{10}$ is responsive to magnetic annealing treatments which usefully modify its ΔE-behavior.

It has been discovered that:

a. by annealing in a magnetic field in the transverse direction, the ΔE-effect is enhanced;

b. by annealing in the longitudinal direction, the ΔE-effect is diminished. These statements are illustrated by the drawing of FIG. 11.

The foregoing and other objects, features and advantages of the invention will be apparent from the following more particular description of preferred embodiments of the invention, as illustrated in the accompanying drawings.

IN THE DRAWINGS

FIG. 1A is a schematic perspective view of a reed oscillator with magnetic field coil thereon in accordance with the principles of this invention to alter Young's modulus of elasticity.

FIG. 1B comprises three line drawings showing the fundamental, first overtone, and second overtone mode shapes of the reed vibrator of FIG. 1A, and whose frequencies are $f_1$, $f_2$ and $f_3$, respectively.

FIG. 1C is a line illustration showing the effect of damping on the width of the resonance curve for natural modes of vibration such as those shown in FIG. 1B. The larger the damping, the larger the width of the resonance curve at some selected fraction of the resonant amplitude $A_{max}$. If $\Delta f$ is the width of the resonance curve at $A_{max}/\sqrt{2}$, the ratio $\Delta f/f$ (where $f$ is the resonant frequency) is equal to $Q^{-1}$, the inverse of the amplitude magnification factor at resonance, $Q$.

FIGS. 2A, 2B, 2C and 2D are perspective partially cut away views of embodiments of this invention wherein the frequency of vibration of a reed oscillator is changed by an applied magnetic field via the ΔE-effect wherein:

FIG. 2A shows the applications of external magnetic field by a pair of Helmholtz coils.

FIG. 2B shows the application of external magnetic field by a coil disposed over only a portion of the reed.

FIG. 2C shows how the applied magnetic field can occur via current flow in the reed.

FIG. 2D illustrates the use of an auxiliary piece of material with ΔE-effect which is affixed to the reed oscillator and the magnetic field control of Young's modulus in the auxiliary piece tunes the frequency of the reed vibration.

FIGS. 5A and 5B are perspective views of two reed vibrators with the same spectrum of vibrational frequencies but with considerably different geometrical design parameters wherein:

FIG. 5A shows a relatively large reed; and

FIG. 5B shows a relatively small reed.

Figure 7:
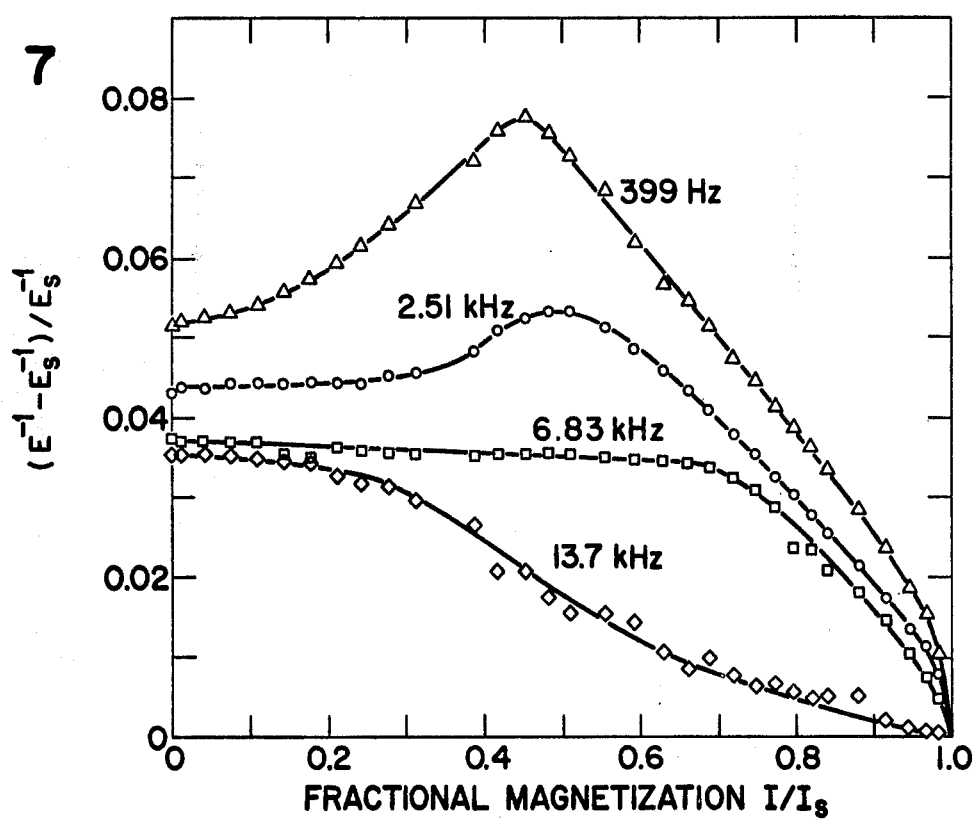

FIG. 7 presents curves showing test data illustrating the reduction of the ΔE-effect with increase in vibration frequency.

Figure 8:
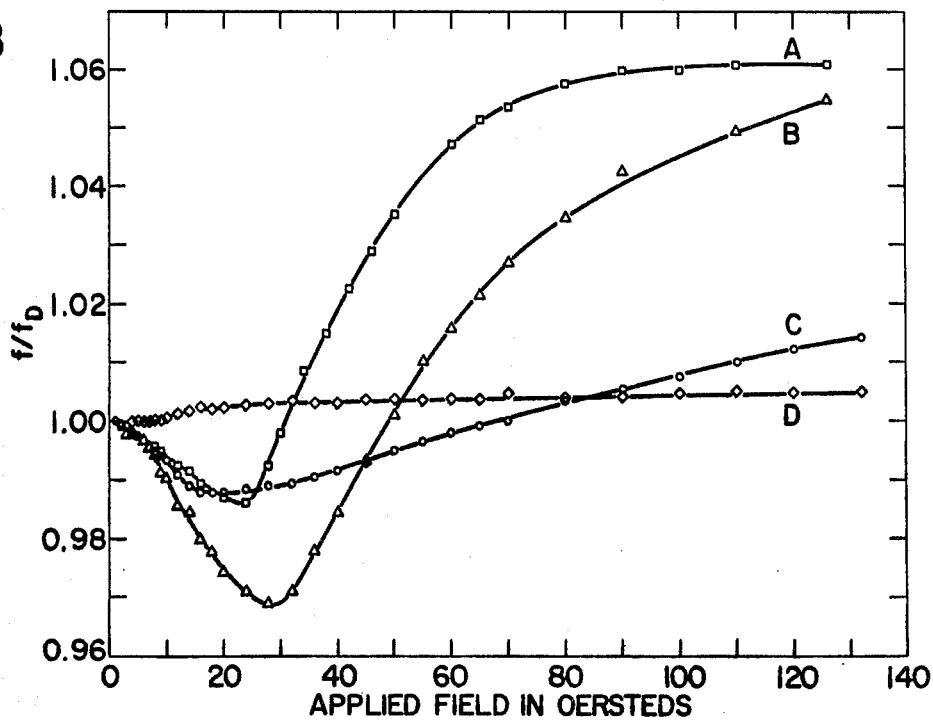

FIG. 8 presents curves showing test data illustrating the change in normalized frequency with applied magnetic field for several crystalline materials with ΔE-effect.

Figure 9:
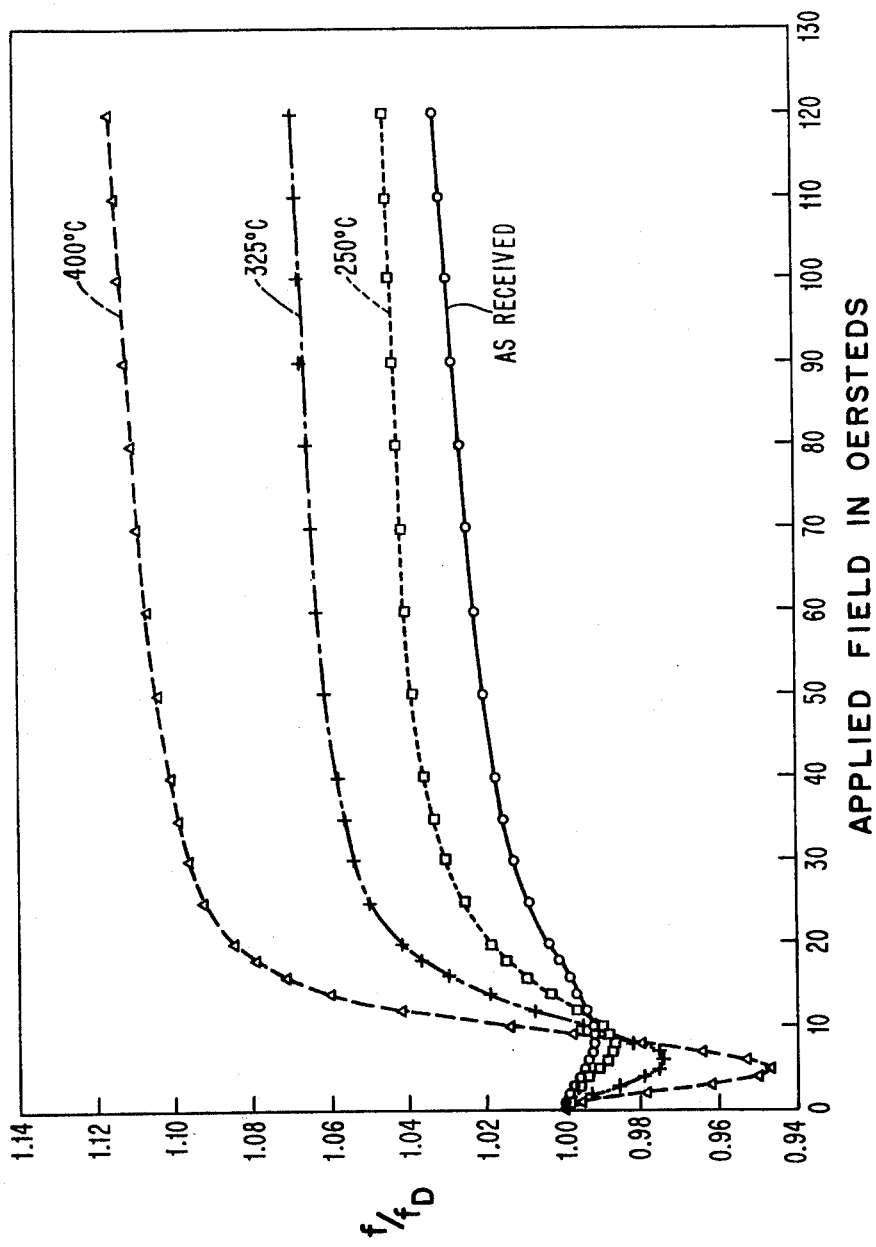

FIG. 9 presents curves showing test data for variation in normalized frequency of a given amorphous material with ΔE-effect for several different annealing conditions.

Figure 10:
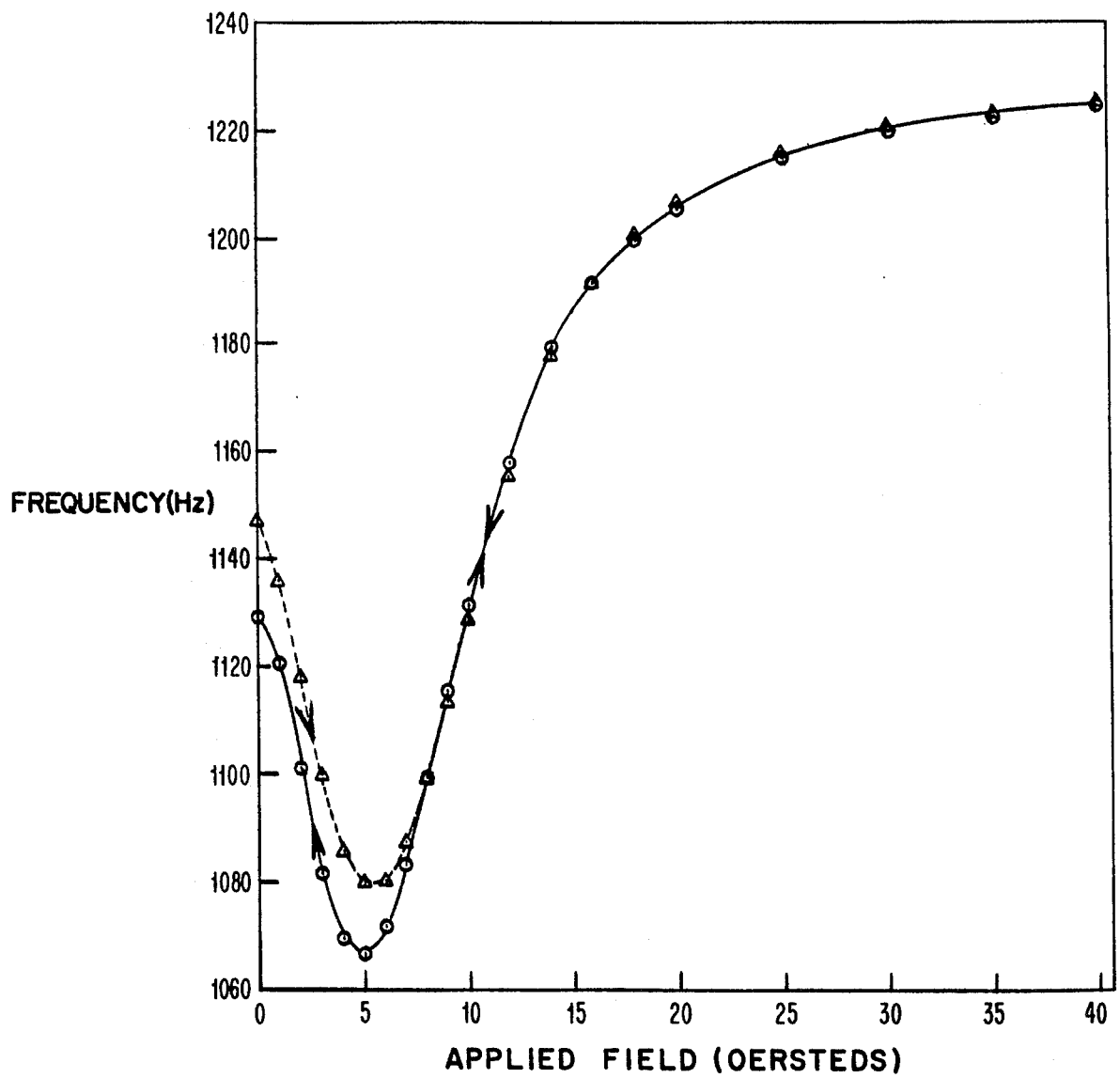

FIG. 10 presents test data showing the absence of hysteresis beyond the minimum point in the frequency vs. field behavior of an $Fe_{75}P_{15}C_{10}$ reed.

Figure 11:
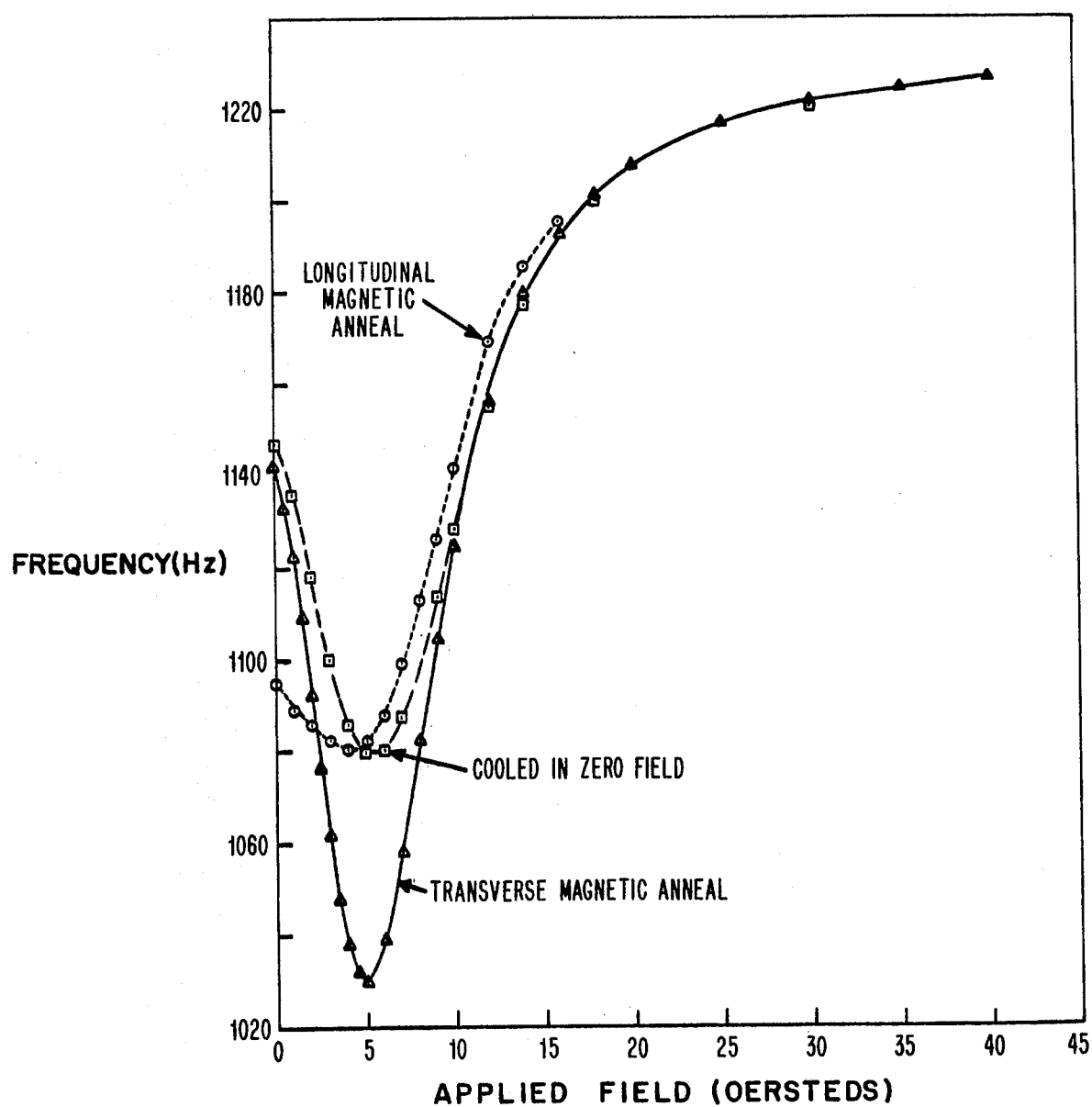

FIG. 11 presents test data showing how magnetic annealing of $Fe_{75}P_{15}C_{10}$ changes the ΔE-effect.

EMBODIMENTS OF THE INVENTION

A schematic diagram of an embodiment of this invention is presented in FIG. 1A for the purpose of description of several physical parameters thereof to be discussed with reference to FIGS. 1B, 1C and 1D. The character of the entirety of the apparatus suitable for the practice of this invention in an embodiment of the character illustrated in FIG. 1A will be described in greater detail hereinafter with reference to the embodiments hereof presented in FIGS. 2A, 2B, 2C and 2D.

Figure 1A:
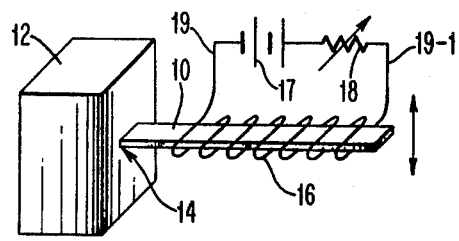
FIG. 1D is a line drawing showing how a vibration of a reed damps out in time naturally.
Figure 1B:
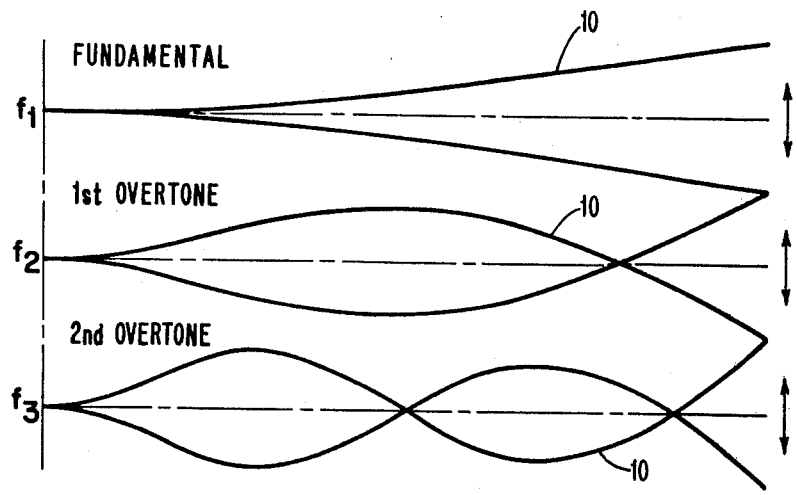

In FIG. 1A a vibrating reed 10 is rigidly affixed to mounting base 12 at support location 14. A magnetic field is introduced longitudinally from the left end to the right end of the vibrating reed 10 by means of a magnetic coil 16 powered from a direct current source consisting of battery 17 and variable resistance 18 connected via leads 19 and 19-1 to the left and right ends of coil 16, respectively. The vibrating reed 10 may conveniently be any material having a Young's modulus of elasticity which may be selectively altered by the presence of a magnetic field therein. Usually such materials are classed as metals or alloys. However, certain materials may be dispersed as particulates within a polymer matrix and suffice for the practice of this invention where taken as a whole the Young's modulus thereof is varied by the presence of a magnetic field in the reed itself. A vibrating reed such as reed 10 shown in FIG. 1A has particular vibrational modes which are characterized by a fundamental frequency and a succession of overtone frequencies. The flexural vibrational modes of a cantilever beam are illustrated by the line drawings presented in FIG. 1B wherein there are depicted the fundamental, first overtone and second overtone for a vibrating reed such as is illustrated in FIG. 1A. All the frequencies of FIG. 1B have nodes at the left end since at those ends the vibrating beam is held rigid by the mount 12. It is the physical nature of a natural mode that once excited it will persist in that vibrational pattern until damped out without converting to one of its other particular frequencies. The fundamental frequency has a node at the left end; the first overtone has a node at the left and a node within a relatively short interval of the right end of the beam; and the second overtone has a node at the left end and two nodes further along the beam. The curves to which the right end portions of the frequency pattern are tangent are directed away from the horizontal.

Figure 1C:
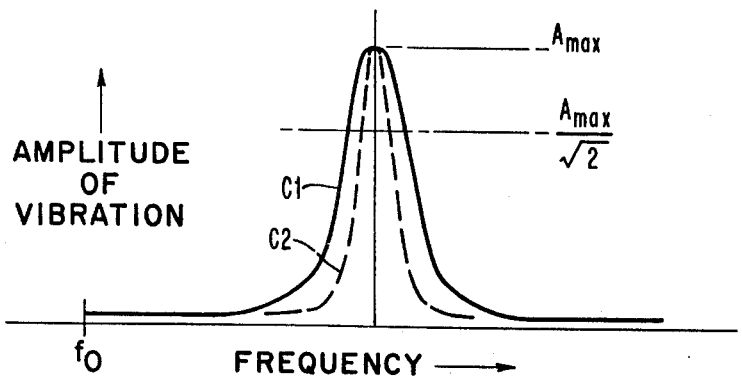

The character of the amplitude of vibration of a cantilever beam versus frequency is shown in FIG. 1C to depict the effect of different degrees of damping. Such damping can occur as a consequence of internal friction in the beam itself or as consequence of applied frictional force such as through the presence of air or other gas. Such damping could, of course, also be accomplished by the presence of a fluid. As seen in FIG. 1C the broader curve C1 indicates that greater damping causes such resonance curves to become wider. The curve C2 of FIG. 1C is a sharply rising curve and approximates the same maximum frequency as the heavily damped curve but has a very narrow spread around the resonant frequency of vibration.

Figure 1D:
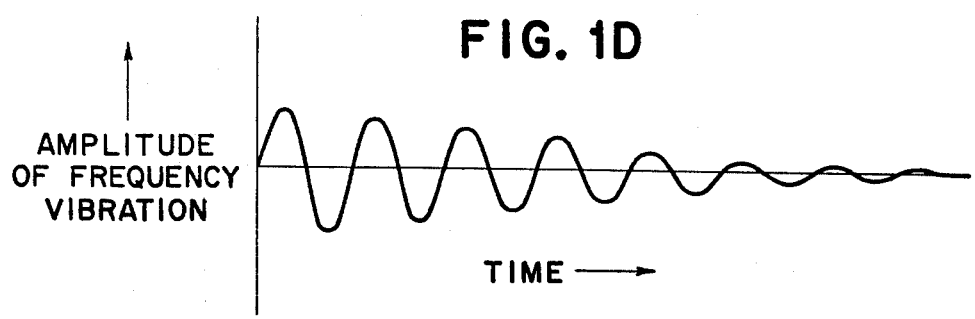

In FIG. 1D there is a pictorial display of a given frequency of a cantilever beam showing that if the beam is not continually excited that once excited the amplitude will necessarily damp out as a consequence of the internal friction even if all other environmental conditions which would cause damping were removed.

Figure 2D:
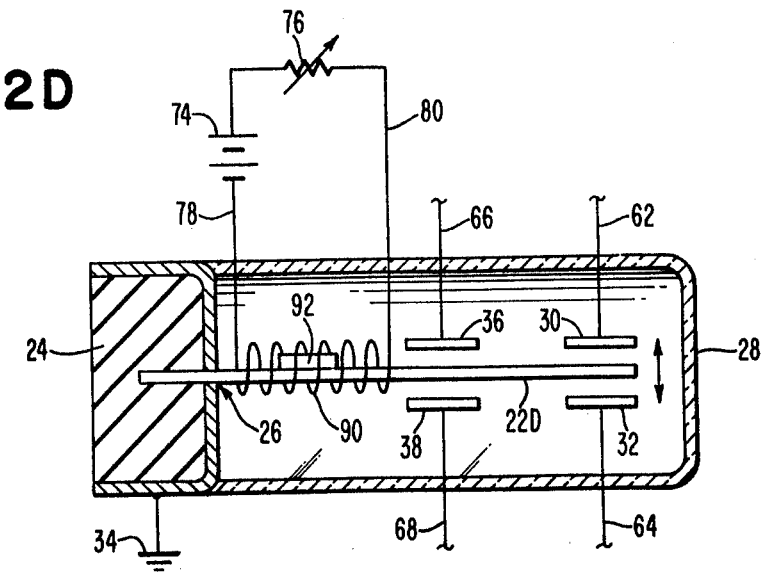

Several embodiments of this invention are presented in FIGS. 2A, 2B and 2D each of which exemplifies a certain application of the principles of this invention for changing the frequency of vibration of a cantilever beam which exhibits a $\Delta E$-effect.

In FIG. 2A the embodiment 20 comprises a vibrating reed 22A firmly mounted in block 24 at contact 26. The reed 22A is disposed in vacuum container 28 which is evacuated in a conventional manner, not shown. The vibration of reed 22A is initiated by potential applied between the electric field plates 30 and 32 communicating with vibrating reed 22A which is grounded at ground 34. The vibration of reed 22A is detected by detector plates 36 and 38 disposed on either side of the reed 22A. The oscillation of reed 22A is initiated by a pulse or series of pulses from oscillator 40 which is electro-magnetically coupled to the field plates 30 and 32. The oscillation of the reed 22A is detected by detector 42 electrically connected to the pickup plates 36 and 38.

The exact connections of the oscillator 40 to drive plates 30 and 32 are via the leads 44 and 46 which communicate via upper and lower switch blades of 48 and 50 of a switch 52 through to the primary winding 54 of a transformer 56. The secondary winding 58 of the transformer 56 is center tapped and grounded via a battery 60 to give a bias with respect to ground. Detector 42 is connected via conductor 66 to plate 36 and via conductor 68 to plate 38. A longitudinal magnetic field is established in reed 22A via Helmholtz coils 70 and 72 disposed respectively to the right end and left end of the reed 22A. Helmholtz coils 70 and 72 provide an axial magnetic field in the reed 22A. These coils are energized by batter 74 via variable resistance 76 via conductors 78 from the left end of battery 74 and via conductor 80 from the right end of variable resistance 76. Once the oscillator reed 22A is set in vibration by oscillator 40, and has established a particular frequency of operation, for example, the fundamental frequency, the feedback via plates 36 and 38 to detector 42 is readily used to cause the vibration to continue at that frequency. This is achieved by feedback paths 82 and 84 to switch blades 48 and 50, respectively, on switch 52. When the oscillation is initiated, the switch blades are caused to be connected respectively to the conductors 82 and 84 from the detector 42. By varying the magnitude of the magnetic field in reed 22A, its frequency is commensurately altered.

A bifilar heating winding 85 is wound around vacuum cover 28 to control the temperature of reed 22A. It is also used for annealing reed 22A in the presence of a magnetic field. The bifilar winding 85 comprises a nichrome wire wound non-inductively as a double helix. The double helix is formed with a return path at point 86 at the left end. Bifilar heating winding 85 is energized by power source 87 which may be either alternating current or direct current.

Several aspects of the embodiments depicted in FIGS. 2B, 2C and 2D are comparable to the embodiment of this invention shown in FIG. 2A and will not be further described as to the aspects with comparable numbers. In FIG. 2B, the magnetic field in reed 22B is established at the left hand portion thereof by magnetic field winding 90. The $\Delta E$-effect when utilized on the left end of the reed 22B is sufficiently effective as to control the frequency of operation of the electro-mechanical oscillator depicted in FIG. 2B.

The embodiment of this invention presented in FIG. 2C includes a reed 22C which is in the form of an open loop so that it may be self-energized to form a magnetic field which will alter its vibrational behavior. Thus, by changing the current in the vibrating reed 22C, its frequency of vibration is commensurately altered.

The embodiment of this invention depicted in FIG. 2D utilizes a vibrating reed 22D to which at the left end portion thereof there is affixed a piece of material having a $\Delta E$-effect 92. By adjusting the magnetic field in the ancillary piece 92 the reed 22D to which it is permanently affixed has its vibrational behavior altered. For the embodiment of FIG. 2D the purpose of the auxiliary or ancillary piece of material 92 with $\Delta E$-effect is to tune a particular frequency since the impact of the ancillary piece 92 is determined in part by its size in relation to reed 22D.

Figure 3:
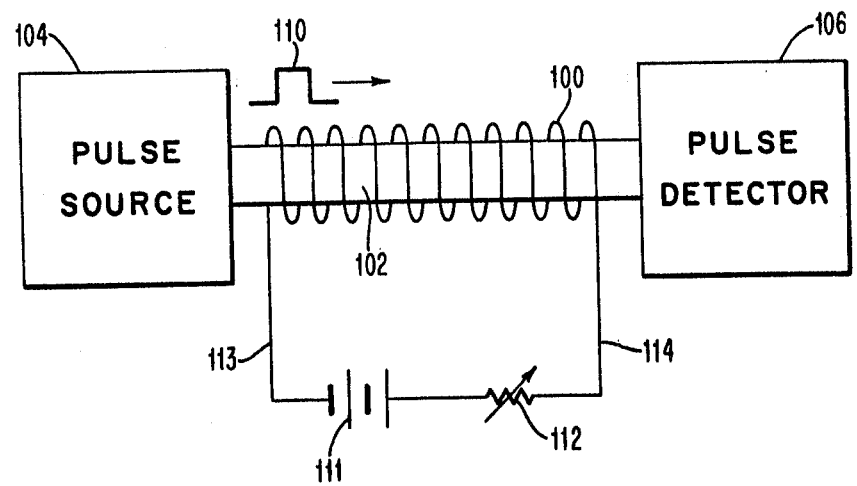
FIG. 3 is a perspective view of another embodiment of this invention wherein the delay time of a sonic delay line is varied through application of a magnetic field to a member which has a ΔE-effect.

Another type of embodiment of this invention is depicted in FIG. 3. This embodiment utilizes the ΔE-effect in a sonic delay line to alter the acoustic pulse delay property thereof. In FIG. 3 a sonic delay line 100 has a magnetic coil 100 wrapped therearound between pulse source 104 and pulse detector 106.

By varying the magnitude of the magnetic field axially in the sonic delay line 102, the delay therein of a pulse 110 launched from pulse source 104 has a different time of travel to pulse detector 106. The magnetic field is produced in coil 100 by energizing it from battery 111 in series with variable resistance 112 and connected by conductors 113 and 114 connected respectively to the left end and right end of coil 100.

Thus, it is possible through the practice of this invention to incorporate in a given apparatus both a variation in frequency as a consequence of varying the ΔE-effect and a variation in delay time in a sonic delay line.

Figure 4A:
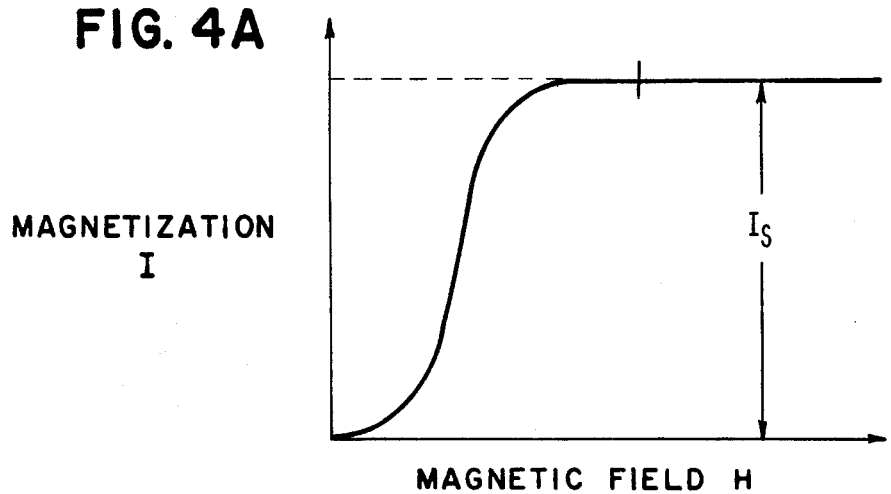
FIG. 4A is a graph showing the variation in magnetization I vs. applied magnetic field H for a ferromagnetic material.
Figure 4B:
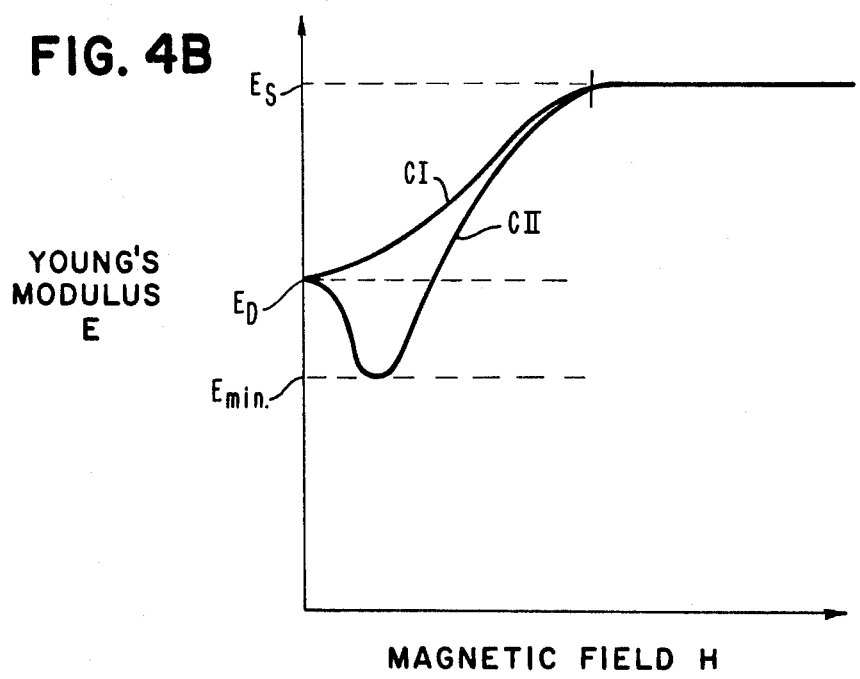
FIG. 4B is a graph presenting two curves illustrative of different forms of ΔE-effect for a given vibration member for particular circumstances of operation and/or geometrical design parameters.

FIG. 4A shows a typical magnetization curve of a ferromagnetic material. The intensity of magnetization, I, increases to a limiting saturation value $I_S$ with increase in the applied magnetic field H. In the saturated condition, Young's modulus of the material has its greatest value $E_S$, as shown in FIG. 4B. For magnetizations less than the saturation value, Young's modulus is invariably smaller than $E_S$. The lowering of Young's modulus stems from the ability of stress to interact with the domain configuration of a ferromagnetic material, and thereby to induce an additional component of strain, which is of magnetostrictive origin. As indicated by the curves CI and CII in FIG. 4B the form of the E vs. H curve can depend considerably on the particular conditions of measurement. Curve CI of FIG. 4B exhibits a monotonic increase of E from the demagnetized value $E_D$ to the saturation value $E_S$. In contrast, curve CII exhibits a minimum value $E_{min}$ and, therefore, a greater total range of the ΔE-effect. Specifically, it has become understood for the practice of this invention that the frequency of measurement is an important factor in controlling the form of the E vs. H curve. The reason for this is that when stress is applied in a dynamic manner, as is the case for a vibrating system, the change which stress tends to produce in the domain configuration is opposed by the generation of a shielding eddy current field, and this effect is greater the higher the frequency. The frequency $f_M$ at which the macro-eddy current shielding becomes appreciable involves certain physical properties of the material, and in addition varies inversely as the square of the sample thickness. Curve CII in FIG. 4B represents a typical behavior for the E vs. H curve under low frequency conditions where shielding effects are not important, i.e., where $f$ is much less than $f_M$. On the other hand, curve CI shows the behavior at such high frequencies that eddy-current shielding now virtually inhibits any stress-induced change in the net or macro-magnetization of the sample ($f$ much greater than $f_M$).

The validity of these remarks is substantiated by the data of FIG. 7, which shows the progressive change in the form of the E vs. I curve for a reed of pure nickel, 0.060 inch thick, as the frequency of measurement is raised by vibrating the sample in turn at its fundamental, second, third and fourth tones vibration, which correspond respectively to the frequencies 0.399, 2.51, 6.83 and 13.7 kilohertz (kH$_z$).

Figure 5A:
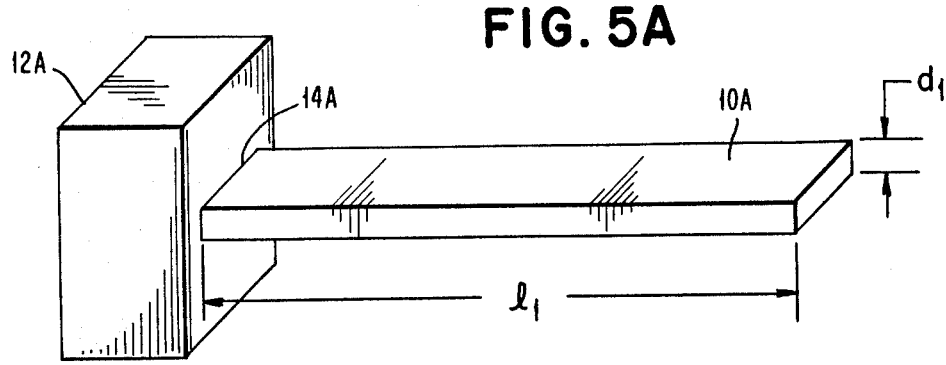
Figure 5B:
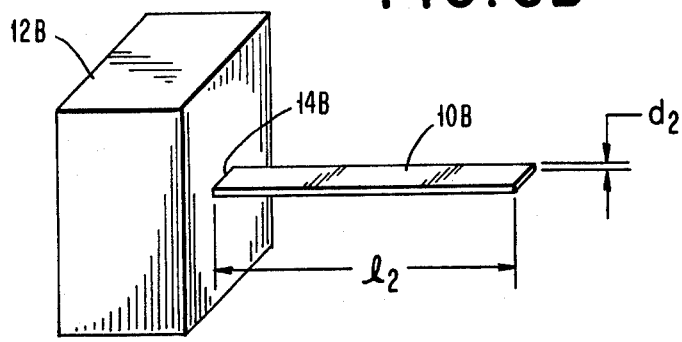

The description of the embodiments of this invention presented in FIGS. 5A and 5B will take account of the principles enunciated with regard to the curves of FIG. 4B where it was demonstrated that through selective design of a vibrating member it is possible to enhance the ΔE-effect by satisfying the condition $f >> f_M$. For example, the vibrating reed oscillators of FIGS. 5A and 5B are identical with the vibrating reed oscillator illustrated with regard to FIG. 1A, except for the particular geometrical parameters utilized in each instance. For convenience of exposition, the embodiments of FIGS. 5A and 5B are comparably numbered to the embodiment of FIG. 1A, except that the numbers employed for FIG. 1A are used with an A in each instance in FIG. 5A and used with a B in each instance in FIG. 5B. The two vibrating reeds will have the same frequencies of vibration if the parameters of thickness $d$ and length $l$ satisfy the relationship $d_1/l_1^2 = d_2/l_2^2$.

In the present example, the same frequency of operation is obtained by giving the reed of FIG. 5A twice the length and four times the thickness of that shown in FIG. 5B. While their operating frequencies are thus the same, their frequencies $f_M$ for macroeddy current shielding differ by a factor of 16, since as noted earlier, $f_M$ varies as $l/d^2$. As a consequence, in an application for the practice of this invention where the maximum range of frequency variation is important and, therefore, a ΔE-behavior of the type shown by curve CII of FIG. 4B is desired, the geometry of FIG. 5B is preferred over that of FIG. 5A.

Thus, it has been demonstrated that through application of the principles of this invention, it is possible selectively to design vibrating members and vibrational systems with particular frequency characteristics in various geometrical configurations.

Figure 6:
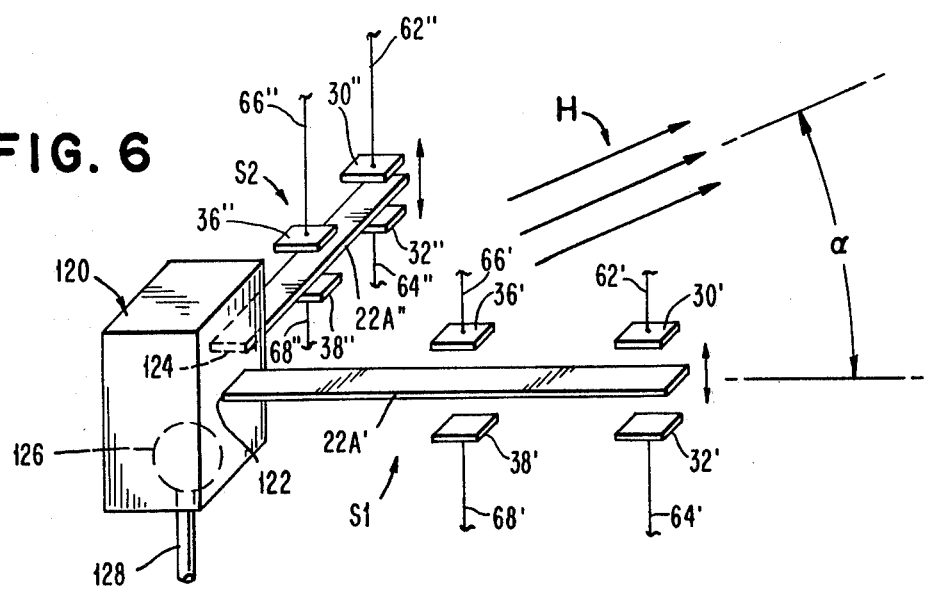
FIG. 6 is a perspective view of a device according to the principles of this invention for monitoring a magnetic field both in direction and in magnitude.

The embodiment of this invention presented in FIG. 6 has particular application for monitoring the direction and magnitude of a given magnetic field. However, it will be understood by one skilled in the art that the principles enunciated for the application of the embodiment of FIG. 6 are also applicable for control purposes in feedback loops where it is desirable to monitor a magnetic field and therefrom to achieve selected control variables in the feedback loop for control of other physical parameters, for example, in a production line having the requirements for process control.

For the embodiment of FIG. 6, two electromechanical reed oscillators, each being similar to the particular mechanical oscillator illustrated in FIG. 2A, but equally capable of being embodied in accordance with the embodiments hereof illustrated in FIGS. 2B, 2C and 2D, are cooperatively related mechanically and electrically. In order that the connections and operation of the embodiment in FIG. 6 be understood in connection with the description presented hereinbefore, the numbers used for the particular aspects of FIG. 2A will be comparably used in FIG. 6 with primes and double primes where applicable. Reed oscillator system S1 and reed oscillator system S2 are cooperatively related mechanically by joining reeds 22A' and 22A'' in perpendicular relationship in a common plane at joining block 120 by locations 122 and 124, respectively. Joining block 120 can be rotatably moved on support sphere 126 which is mounted on rod 128. By inserting the embodiment of this invention shown in FIG. 6 in a magnetic field H and thereafter monitoring the relationship between the outputs of their respective detector units, not shown, but comparable to detector unit 42 of FIG. 2A, it is possible to determine both the direction, as related to the angle α, and field intensity of the magnetic field H.

TESTS FOR THE INVENTION

By way of illustrating the magnitude of the ΔE-effect in some common crystalline magnetic materials, data are shown in FIG. 8 for the following materials: Fe-30%Ni (curve A), Fe-28%Co (curve B), pure Ni (curve C) and Fe-2½% Si (curve D). These data were obtained on thin reeds, satisfying the condition $f < f_M$. For comparison purposes, the actual frequencies $f$ are referred to the frequency in the demagnetized condition $f_D$. The maximum variation shown in FIG. 8 was obtained with the Fe-28% Co alloy and amounts to about 8% change in frequency, i.e., about 16% change in E. From the prior art, larger variations could be expected from alloys of higher cobalt content.

For comparison with the well-known crystalline materials of FIG. 8, the data of FIG. 9 were obtained with a reed of the amorphous $Fe_{75}P_{15}C_{10}$ material mentioned previously. The ΔE-effect is small in that material in the as-prepared condition, but increases very significantly upon annealing at the progressively higher temperatures indicated, which lie below the crystallization temperature. The effect of annealing can be readily understood in terms of the removal of internal stress from the material. After the 400° C anneal, the maximum range of frequency variation is 15%, which is almost twice the maximum variation shown for the crystalline materials of FIG. 8. In addition, with the annealed $Fe_{75}P_{15}C_{10}$ material, a substantial frequency variation can be obtained with a relatively small change in field, which can be advantageous in some applications.

FIG. 10 illustrates for the case of the 400° C annealed $Fe_{75}P_{15}C_{10}$ amorphous material that for fields somewhat beyond the minimum, ($E_{min}$ of FIG. 4B) there is almost no hysteresis between the frequency variation seen with an increasing or decreasing field. By operating a device within this reversible range, it is thus possible to describe uniquely, in terms of a single calibration curve, the frequency-field relationship.

It is demonstrated by FIG. 11 for the further utility of this invention that the ΔE-effect of a ferromagnetic alloy can be usefully modified by a magnetic annealing treatment, wherein the material is heated to above the Curie point, and allowed to cool slowly in the presence of a saturating magnetic field applied along some selected direction. The data of FIG. 11 for the $Fe_{75}P_{15}C_{10}$ material are unusual in that they demonstrate for the first time that an amorphous alloy can be responsive to a magnetic annealing treatment. The particular treatment used in FIG. 11 consisted of heating the sample to 380° C, i.e., 50° C above the Curie point of 330° C, and cooling to room temperature over several hours at the natural cooling rate of the furnace assembly, in a saturating field. The notable feature of FIG. 11 is that the frequency range is substantially extended after annealing with the field direction applied transversely, so as to magnetize the specimen along its width during the cooling period.

We claim:

1. Method for inducing uniaxial magnetic anisotropy in an amorphous ferromagnetic alloy, comprising the steps of:
   providing an amorphous ferromagnetic alloy with substantially amorphous structure such as that producible by the method of splat cooling, and
   magnetically annealing said alloy for times and temperatures confined to values which do not produce substantial crystallization therein, said magnetic annealing comprising the steps of
   applying an approximately saturating magnetic field to said alloy along a direction in which the easy axis of said uniaxial anisotropy is to be induced, with an accompanying
   heating of said alloy to temperatures no higher than that at which said amorphous alloy exceeds its Curie point for a time period sufficient to induce said anisotropy in said alloy, and
   cooling said alloy with said induced uniaxial magnetic anisotropy therein to room temperature, at a rate to yield a substantially amorphous structure.

2. Method as set forth in claim 1 wherein said alloy is comprised of approximately 75 percent ferromagnetic metals by atomic composition.

3. Method as set forth in claim 1 wherein said magnetic annealing of said alloy is maintained for a time period of at least an hour.

4. Method as set forth in claim 1 wherein said alloy is of approximate atomic composition $Fe_{75}P_{15}C_{10}$.

5. Method as set forth in claim 1 wherein said alloy exhibits a ΔE-effect, and
   said alloy with said induced uniaxial magnetic anisotropy has said ΔE-effect selectively altered along specific directions in said alloy.

6. Method as set forth in claim 1 including the additional step prior to said magnetic annealing step of
   annealing thermally said provided alloy for a given period to achieve a reduction of internal stress using temperatures which may exceed the Curie point of said alloy but do not exceed the crystallization temperature of said alloy.

* * * * *